United States Patent
DiMaria

(10) Patent No.: US 11,901,491 B2
(45) Date of Patent: Feb. 13, 2024

(54) LIGHT EMITTING DIODE DEVICES

(71) Applicant: Lumileds LLC, San Jose, CA (US)

(72) Inventor: Jeffrey DiMaria, San Jose, CA (US)

(73) Assignee: Lumileds LLC, San Jose, CA (US)

(*) Notice: Subject to any disclaimer, the term of this patent is extended or adjusted under 35 U.S.C. 154(b) by 137 days.

(21) Appl. No.: 17/189,459

(22) Filed: Mar. 2, 2021

(65) Prior Publication Data

US 2022/0140199 A1    May 5, 2022

Related U.S. Application Data

(60) Provisional application No. 63/107,109, filed on Oct. 29, 2020.

(51) Int. Cl.
| | |
|---|---|
| *H01L 33/44* | (2010.01) |
| *H01L 33/46* | (2010.01) |
| *H01L 33/00* | (2010.01) |
| *H01L 33/36* | (2010.01) |
| *H01L 33/20* | (2010.01) |

(52) U.S. Cl.
CPC ............. *H01L 33/44* (2013.01); *H01L 33/46* (2013.01); *H01L 33/007* (2013.01); *H01L 33/20* (2013.01); *H01L 33/36* (2013.01); *H01L 2933/0016* (2013.01); *H01L 2933/0025* (2013.01)

(58) Field of Classification Search
CPC . H01L 33/44; H01L 33/46; H01L 2933/0016; H01L 33/36; H01L 2933/0025; H01L 33/007; H01L 33/20
See application file for complete search history.

(56) References Cited

U.S. PATENT DOCUMENTS

| | | |
|---|---|---|
| 6,206,065 B1 | 3/2001 | Robbie et al. |
| 6,410,942 B1 | 6/2002 | Thibeault et al. |
| 6,657,236 B1 | 12/2003 | Thibeault et al. |
| 6,821,804 B2 | 11/2004 | Thibeault et al. |
| 7,943,406 B2 | 5/2011 | Slater, Jr. et al. |
| 8,212,273 B2 | 7/2012 | Mckenzie |
| 8,222,811 B2 | 7/2012 | Vaufrey et al. |

(Continued)

FOREIGN PATENT DOCUMENTS

| | | |
|---|---|---|
| DE | 102010051286 A1 | 5/2012 |
| DE | 102012109460 A1 | 4/2014 |

(Continued)

OTHER PUBLICATIONS

PCT International Search Report and Written Opinion in PCT/US2021/051173 dated Jan. 7, 2022, 11 pages.

(Continued)

*Primary Examiner* — Savitri Mulpuri
(74) *Attorney, Agent, or Firm* — Servilla Whitney LLC

(57) ABSTRACT

Described are light emitting diode (LED) devices comprising a mesa with semiconductor layers, the semiconductor layers including an N-type layer, an active layer, and a P-type layer. The mesa has a top surface and at least one side wall, the at least one side wall defining a trench having a bottom surface. A passivation layer is on the at least one side wall and on the top surface of the mesa, the passivation layer comprises one or more a low-refractive index material and distributed Bragg reflector (DBR). A p-type contact is on the top surface of the mesa, and an n-type contact on the bottom surface of the trench.

6 Claims, 7 Drawing Sheets

(56) References Cited

U.S. PATENT DOCUMENTS

| | | |
|---|---|---|
| 8,258,044 B2 | 9/2012 | Brun et al. |
| 8,487,340 B2 | 7/2013 | Gilet et al. |
| 8,638,032 B2 | 1/2014 | Maindron et al. |
| 8,647,957 B2 | 2/2014 | Borowik et al. |
| 8,664,635 B2* | 3/2014 | Jung .................. H01L 33/56 257/E33.012 |
| 8,697,548 B2 | 4/2014 | Borowik et al. |
| 8,698,396 B2 | 4/2014 | Maindron et al. |
| 8,754,426 B2 | 6/2014 | Marx et al. |
| 8,890,111 B2 | 11/2014 | Templier et al. |
| 8,969,900 B2 | 3/2015 | Sabathil et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 10,388,641 B2 | 8/2019 | Martin |
| 10,811,460 B2* | 10/2020 | Dimitropoulos ...... H01L 27/156 |
| 10,964,845 B2* | 3/2021 | Dimitropoulos ...... H01L 27/156 |
| 10,985,294 B2* | 4/2021 | White .................. H01L 33/44 |
| 11,211,525 B2* | 12/2021 | Rajan .................. H01L 33/06 |
| 11,424,388 B2* | 8/2022 | Choi .................. H01L 25/167 |
| 2002/0139987 A1 | 10/2002 | Collins, III et al. |
| 2007/0206130 A1 | 9/2007 | Wuu et al. |
| 2008/0099787 A1 | 5/2008 | Coolbaugh et al. |
| 2008/0173884 A1 | 7/2008 | Chitnis et al. |
| 2008/0179602 A1 | 7/2008 | Negley et al. |
| 2010/0078656 A1 | 4/2010 | Seo et al. |
| 2011/0147704 A1 | 6/2011 | Jiang et al. |
| 2011/0151607 A1 | 6/2011 | Landis et al. |
| 2011/0266551 A1 | 11/2011 | Thompson et al. |
| 2011/0287606 A1 | 11/2011 | Brun et al. |
| 2012/0050694 A1 | 3/2012 | Huang et al. |
| 2012/0091481 A1 | 4/2012 | Sekine et al. |
| 2012/0205614 A1 | 8/2012 | Templier et al. |
| 2012/0235189 A1* | 9/2012 | Hsu .................. H01L 33/02 257/98 |
| 2013/0020115 A1 | 1/2013 | Mataye et al. |
| 2013/0112945 A1 | 5/2013 | Gilet et al. |
| 2013/0256708 A1 | 10/2013 | Jin et al. |
| 2013/0292719 A1* | 11/2013 | Lee .................. H01L 27/156 257/93 |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2014/0159071 A1* | 6/2014 | Choi .................. H01L 27/15 257/88 |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0284941 A1* | 9/2016 | Seo .................. H01L 33/56 |
| 2016/0293811 A1 | 10/2016 | Hussell et al. |
| 2016/0336483 A1 | 11/2016 | Shatalov et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0236979 A1* | 8/2017 | Seo .................. H01L 33/44 257/88 |
| 2017/0243860 A1 | 8/2017 | Hong et al. |
| 2017/0293065 A1 | 10/2017 | Kim |
| 2017/0294418 A1 | 10/2017 | Edmond et al. |
| 2017/0309794 A1 | 10/2017 | Von Malm |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1 | 9/2018 | Gmeinsieser et al. |
| 2018/0283642 A1 | 10/2018 | Liao et al. |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20150144048 A | 12/2015 |
| KR | 20170018687 A | 2/2017 |
| KR | 20180010670 A | 1/2018 |
| KR | 20180114413 A | 10/2018 |

(56) References Cited

FOREIGN PATENT DOCUMENTS

| | | |
|---|---|---|
| NO | 2018139866 A1 | 8/2018 |
| TW | 201417339 A | 5/2014 |
| TW | 201620163 A | 6/2016 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |
| WO | 2016079505 A1 | 5/2016 |
| WO | 2017089676 A1 | 6/2017 |
| WO | 2017102708 A1 | 6/2017 |
| WO | 2017184686 A | 10/2017 |
| WO | 2017216445 A1 | 12/2017 |
| WO | 2018091657 A1 | 5/2018 |
| WO | 2018143682 A1 | 8/2018 |
| WO | 2018159977 A1 | 9/2018 |
| WO | 2018169243 A1 | 9/2018 |
| WO | 2019126539 A | 6/2019 |

OTHER PUBLICATIONS

Arl, D., et al., "SiO2 thin film growth through a pure atomic layer deposition technique at room temperature†", RSC Adv., 2020, 10, 18073.

Barranco, A., et al., "Room temperature synthesis of porous SiO 2 thin films by plasma enhanced chemical vapor deposition", Journal of Vacuum Science & Technology A 22, 1275 (2004); doi: 10.1116/1.1761072.

Dupré, Ludovic, et al., "Processing and characterization of high resolution GaN/InGaN LED arrays at 10 micron pitch for micro display applications.", Proc. of SPIE vol. 10104 1010422-1.

\* cited by examiner

LIGHT EMITTING DIODE DEVICES

CROSS-REFERENCE TO RELATED APPLICATIONS

This application claims priority to U.S. Provisional Application No. 63/107,109, filed Oct. 29, 2020, the entire disclosure of which is hereby incorporated by reference herein.

TECHNICAL FIELD

Embodiments of the disclosure generally relate to light emitting diode (LED) devices and methods of manufacturing the same. More particularly, embodiments are directed to light emitting diode devices that include a conformal passivation layer.

BACKGROUND

A light emitting diode (LED) is a semiconductor light source that emits visible light when current flows through it. LEDs combine a P-type semiconductor with an N-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$) or silicon carbide (SiC).

Various emerging display applications, including wearable devices, head-mounted, and large-area displays require miniaturized chips composed of arrays of microLEDs (μLEDs or uLEDs) with a high density having a lateral dimension down to less than 100 μm×100 μm. MicroLEDs (uLEDs) typically have dimensions of about 50 μm in diameter or width and smaller that are used to in the manufacture of color displays by aligning in close proximity microLEDs comprising red, blue and green wavelengths.

Micro-LEDs are unique pixel architectures that require fundamentally different design rules for efficient operation than larger, monolithic die. The size of micro-LEDs runs up against the limits of industrially-scalable, photolithographic process capabilities that allow for large die (>20:1 bulk-sidewall aspect ratio) to operate efficiently, e.g. complex mirror and electrical contact geometries. Additionally, due to having <20:1 bulk:sidewall aspect ratio for a typical device, surface recombination effects dominate device behaviour, particularly at low currents that are relevant to micro LED display applications. To mitigate the negative effect of surface recombination on reduced light output, electrical passivation may be required.

SUMMARY

Embodiments of the disclosure are directed to a LED device and methods for their manufacture. A first aspect pertains to a light emitting diode (LED) device comprising: a mesa comprising semiconductor layers, the semiconductor layers including an N-type layer, an active layer, and a P-type layer, the mesa having a top surface and at least one side wall, the at least one side wall defining a trench have a bottom surface; a passivation layer on the at least one side wall and on the top surface of the mesa, the passivation layer comprising one or more a low-refractive index material and distributed Bragg reflector (DBR); a p-type contact on the top surface of the mesa; and an n-type contact on the bottom surface of the trench.

Another aspect of the disclosure pertains to method of manufacturing a light emitting diode (LED) device comprising: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a passivation layer on the at least one side wall and on the top surface of the at least one mesa, the passivation layer comprising one or more a low-refractive index material and distributed Bragg reflector (DBR); forming a p-type contact on the top surface of the at least one mesa; and forming an n-type contact in the at least one trench.

Another aspect of the disclosure pertains to a light emitting diode (LED) device comprising: a mesa comprising semiconductor layers, the semiconductor layers including an N-type layer, an active layer, and a P-type layer, the mesa having a height less than or equal to its width, the mesa having a top surface and at least one side wall, the at least one side wall defining a trench have a bottom surface; a first passivation on the at least one side wall and on the top surface of the mesa, the mirror layer comprising one or more of a silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$); a second passivation layer on the first passivation layer, the second passivation layer comprising one or more of a distributed Bragg reflector (DBR) and a low-refractive index material having a refractive index in a range of from about 1 to about 2.2; a p-type contact on the top surface of the mesa; and an n-type contact on the bottom surface of the trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1A:
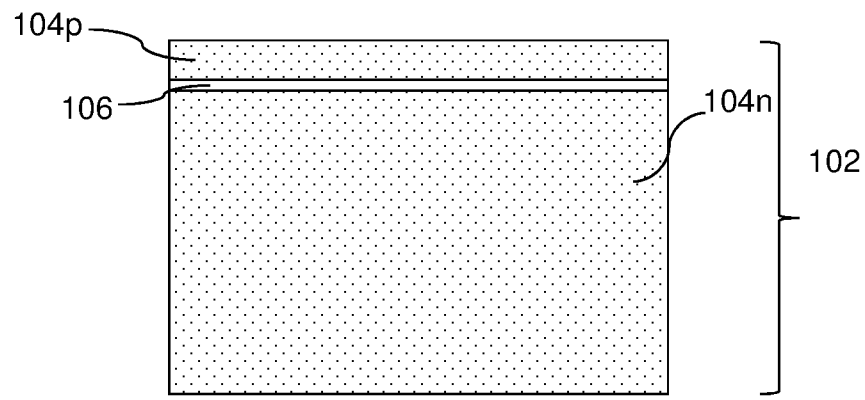
FIG. 1A illustrates a cross-sectional view of a stack of epitaxial layers according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AlN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe arrays of LED devices and methods for forming arrays of LED devices (or LED arrays). In particular, the present disclosure describes LED devices and methods to produce LED devices which have low optical loss due to the presence of a low-loss, low-index passivation layer. A low-loss, low-index passivation layer is beneficial over a standard passivation layer, e.g. silicon nitride (SiN), because it has lower optical loss, and because the low-index passivation layer increases the reflectivity between the semiconductor and dielectric and acts as a mirror due to Fresnel reflection and reduced total-internal-reflection angle. This has the effect of reducing the interaction of light with any microLED back-plane and subsequently reduces system optical losses. An additional effect is that light is more highly confined to the semiconductor pixel area, improving pixel luminance and crosstalk between adjacent pixels. One or more embodiments of the disclosure can be used in the fabrication of microLED displays.

FIG. 1A is a cross-sectional view of a step in the manufacture of a LED device according to one or more embodiments. With reference to FIG. 1A, semiconductor layers 102 are grown on a substrate (not illustrated). The semiconductor layers 102 according to one or more embodiments comprise epitaxial layers, III-nitride layers or epitaxial III-nitride layers. In one or more embodiments, the semiconductor layers are epitaxial semiconductor layers having a thickness at least 1 micron.

The substrate may be any substrate known to one of skill in the art. In one or more embodiments, the substrate comprises one or more of sapphire, silicon carbide, silicon (Si), quartz, magnesium oxide (MgO), zinc oxide (ZnO), spinel, and the like. In one or more embodiments, the substrate is not patterned prior to the growth of the Epi-layer. Thus, in some embodiments, the substrate is not patterned and can be considered to be flat or substantially flat. In other embodiments, the substrate is patterned, e.g. patterned sapphire substrate (PSS).

In one or more embodiments, the semiconductor layers 102 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 102 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 102 comprise a p-type layer 104p, an active region 106, and an n-type layer 104n. In specific embodiments, the n-type layer 104n and p-type layer 104p of the LED comprise n-doped and p-doped GaN.

In one or more embodiments, the layers of III-nitride material which form the LED are deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD). In other embodiments, the substrate is placed in a metalorganic vapor-phase epitaxy (MOVPE) reactor for epitaxy of LED device layers to grow the semiconductor layers 102.

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. A PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step may be conducted between the delivery of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, the semiconductor layers 102 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 102 comprise an n-type layer 104n, an active layer 106 and a p-type layer 104p.

In one or more embodiments, the semiconductor layers 102 have a combined thickness in a range of from about 1 µm to about 10 µm, including a range of from about 1 µm to about 9 µm, 1 µm to about 8 µm, 1 µm to about 7 µm, 1 µm to about 6 µm, 1 µm to about 5 µm, 1 µm to about 4 µm, 1 µm to about 3 µm, 2 µm to about 10 µm, including a range of from about 2 µm to about 9 µm, 2 µm to about 8 µm, 2 µm to about 7 µm, 2 µm to about 6 µm, 2 µm to about 5 µm, 2 µm to about 4 µm, 2 µm to about 3 µm, 3 µm to about 10 µm, 3 µm to about 9 µm, 3 µm to about 8 µm, 3 µm to about 7 µm, 3 µm to about 6 µm, 3 µm to about 5 µm, 3 µm to about 4 µm, 4 µm to about 10 µm, 4 µm to about 9 µm, 4 µm to about 8 µm, 4 µm to about 7 µm, 4 µm to about 6 µm, 4 µm to about 5 µm, 5 µm to about 10 µm, 5 µm to about 9 µm, 5 µm to about 8 µm, 5 µm to about 7 µm, 5 µm to about 6 µm, 6 µm to about 10 µm, 6 µm to about 9 µm, 6 µm to about 8 µm, 6 µm to about 7 µm, 7 µm to about 10 µm, 7 µm to about 9 µm, or 7 inn to about 8 µm.

In one or more embodiments, an active region 106 is formed between the n-type layer 104n and the p-type layer 104p. The active region 106 may comprise any appropriate materials known to one of skill in the art. In one or more embodiments, the active region 106 is comprised of a III-nitride material multiple quantum wells (MQW), and a III-nitride electron blocking layer.

Figure 1B:
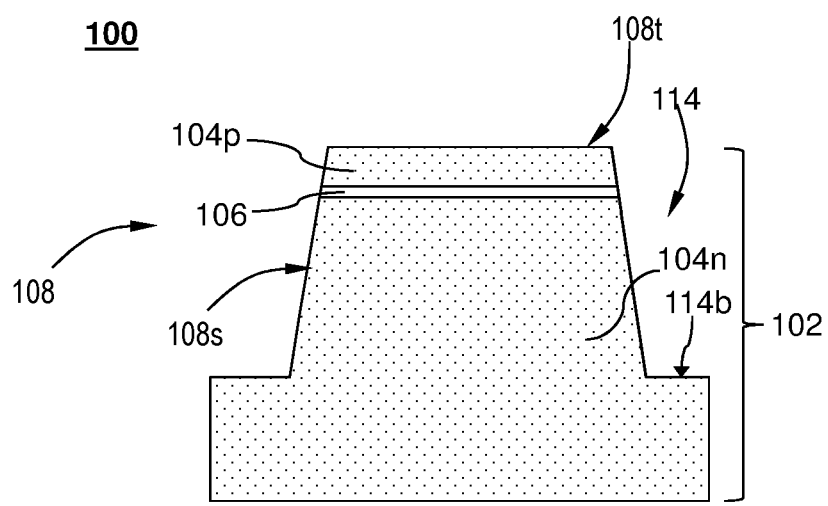
FIG. 1B illustrates a cross-sectional view of a step in the manufacture of a LED device according to one or more embodiments.

FIG. 1B is a cross-sectional view of a step in the manufacture of a LED device 100 according to one or more embodiments. With reference to FIG. 1B, the semiconductor layers 102 are etched to form a mesa 108. In the embodiment illustrated in FIG. 1B, the mesa 108 has a top surface 108t and at least one side wall 108s, the at least one side wall 108s defining a trench 114 having a bottom surface 114b. In one or more embodiments, the trench 114 has a depth from a top surface 108t of the semiconductor layers 102 forming the mesa 108 in a range of from about 0.5 µm to about 2 µm.

Figure 1C:
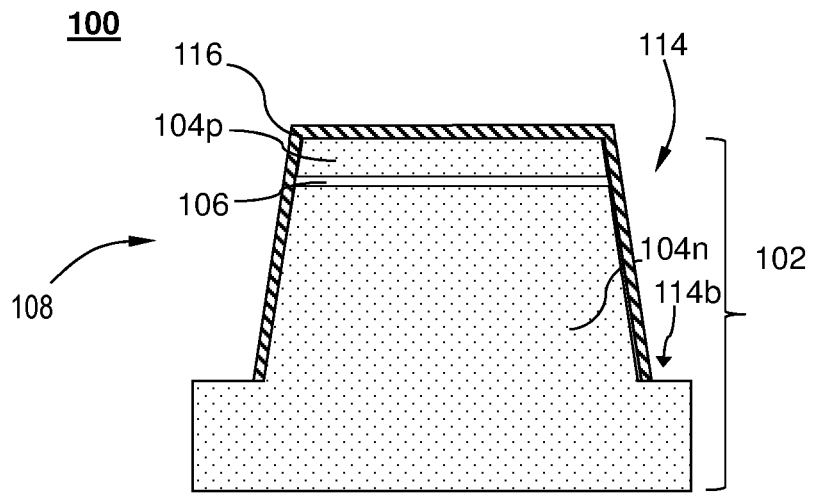
FIG. 1C illustrates a cross-sectional view of a step in the manufacture of a LED device according to one or more embodiments.

FIG. 1C is a cross-sectional view of a step in the manufacture of a LED device 100 according to one or more embodiments. With reference to FIG. 1C, a passivation layer 116 is deposited on the top surface 108t and on the side wall(s) 108s of the mesa 108. In some embodiments, the passivation layer 116 is a substantially conformal layer. As used herein, the term "conformal" means that the layer adapts to the contours of the mesa. Conformality of a layer is typically quantified by a ratio of the average thickness of a layer deposited on the sidewalls of a feature, i.e. the mesa, to the average thickness of the same deposited layer on the field, or upper surface, of the mesa. A layer which is substantially conformal varies in thickness by less than or equal to about 5%, 2%, 1% or 0.5%.

In one or more embodiments, the passivation layer 116 does not form on the bottom surface 114b of the trench 114. In some embodiments, the passivation layer 116 has a thickness of at least 2 nm. In one or more embodiments, the passivation layer 116 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the passivation layer 116 comprises a low-loss, low-index dielectric material. As used herein, the term "dielectric" refers to an electrical insulator material that can be polarized by an applied electric field. In one or more embodiments, the low-loss, low-index dielectric material may comprise any suitable material known to the skill artisan. In some embodiments, the low-loss, low-index dielectric material comprises a material having a refractive index, k-value, in a range of from about 1 to about 2.2.

In some embodiments, the low-loss, low-refractive index material comprises a material selected from the group consisting of silicon oxide ($SiO_2$), magnesium fluoride ($MgF_2$), lithium fluoride (LiF), porous silicon oxide ($SiO_x$), porous silicon oxynitride (SiON), porous silicon nitride (SiN), porous titanium oxide ($TiO_x$), porous aluminum oxide (AlO$_x$), porous hafnium oxide (HfO$_x$), porous niobium oxide (NbO$_x$), porous aluminum indium gallium nitride (AlInGaN), and porous aluminum indium gallium phosphide (AlInGaP). In one or more embodiments, the low-loss, low-refractive index material comprises a material selected from the group consisting of magnesium fluoride (MgF$_2$), lithium fluoride (LiF), porous silicon oxide (SiO$_x$), porous silicon oxynitride (SiON), porous silicon nitride (SiN), porous titanium oxide (TiO$_x$), porous aluminum oxide (AlO$_x$), porous hafnium oxide (HfO$_x$), porous niobium oxide (NbO$_x$), porous aluminum indium gallium nitride (AlInGaN), and porous aluminum indium gallium phosphide (AlInGaP). In one or more embodiments, the low-loss, low-refractive index material comprises silicon oxide (SiO$_2$). In one or more embodiments, the low-loss, low-refractive index material comprises magnesium fluoride (MgF$_2$). In one or more embodiments, the low-loss, low-refractive index material comprises lithium fluoride (LiF). In one or more embodiments, the low-loss, low-refractive index material comprises porous silicon oxide (SiO$_x$). In one or more embodiments, the low-loss, low-refractive index material comprises porous silicon oxynitride (SiON). In one or more embodiments, the low-loss, low-refractive index material comprises porous silicon nitride (SiN). In one or more embodiments, the low-loss, low-refractive index material comprises porous titanium oxide (TiO$_x$). In one or more embodiments, the low-loss, low-refractive index material comprises porous aluminum oxide (AlO$_x$). In one or more embodiments, the low-loss, low-refractive index material comprises porous hafnium oxide (HfO$_x$). In one or more embodiments, the low-loss, low-refractive index material comprises porous niobium oxide (NbO$_x$). In one or more embodiments, the low-loss, low-refractive index material comprises porous aluminum indium gallium nitride (AlInGaN). In one or more embodiments, the low-loss, low-refractive index material comprises porous aluminum indium gallium phosphide (AlInGaP).

In one or more embodiments, the passivation layer 116 comprises a distributed Bragg reflector (DBR). Bragg reflectors are typically made of multilayers of alternating thin film materials of different refractive index, wherein high reflectance is one of the key attributes. A Bragg reflector or mirror is a structure formed from a multilayer stack of alternating thin film materials with varying refractive index, for example high- and low-index films. As a result of inter-layer mixing during multilayer depositions, additional interfacial layers form between adjacent layers of different materials. Bragg reflectors must have high reflectance. The structure and properties of the interfacial layers in the multilayer stack play a vital role in the reflectance of Bragg reflectors. In some embodiments, the distribute Bragg reflector has a thickness of at least 0.2 microns.

In one or more embodiments, a DBR could be utilized as a low-loss mirror, but requires about 2 microns to about 3 microns of thickness for efficient reflective properties. In one or more embodiments, in microLED applications, where die sizes are less than 10 microns on a side, there may not be a sufficient process window to allow for the use of a DBR coating. Conflicting design rules include the allowed spacing between p and n electrical contacts, overall LED mesa and pixel size, and stack-height or planarity limitations of the micro LED when integrated on an electrical back-plane. Accordingly, for architectures with pixel sizes less than 10 microns to a side, a low-index, low-loss passivation layer provides sufficient electrical passivation and mirror functions, and integrates well into scalable, manufacturable processes.

In some embodiments, an optional electrical passivation layer may be deposited on the mesa 108 prior to deposition of the passivation layer 116. In one or more embodiments, the electrical passivation layer is deposited as a substantially conformal layer on the passivation layer 116. Thus, in some embodiments, there may be an electrical passivation layer between the passivation layer 116 and the top surface 108$t$ of the mesa 108. In some embodiments, the optional electrical passivation layer may comprise one of more of silicon nitride (SiN), titanium oxide (TiO$_2$), niobium oxide (NbO$_2$), aluminum oxide (Al$_2$O$_3$), hafnium oxide (HfO$_2$), aluminum nitride (AlN), silicon dioxide (SiO$_2$), and hafnium-doped silicon dioxide (HfSiO$_2$).

Figure 1D:
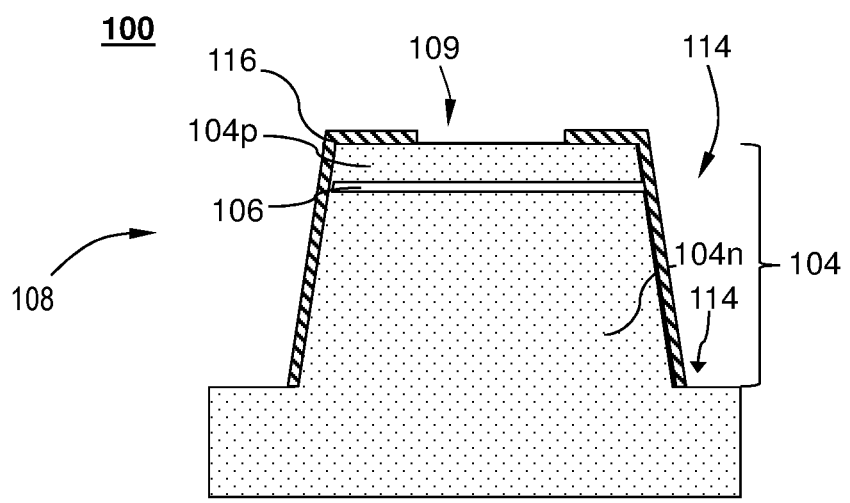
FIG. 1D illustrates a cross-sectional view of a step in the manufacture of a LED device according to one or more embodiments.

FIG. 1D is cross-sectional view of a step in the manufacture of a LED device 100 according to one or more embodiments. With reference to FIG. 1D, the mesa 108 having the passivation layer 116 thereon is patterned to form an opening 109 on the top surface 108$t$ of the mesa, exposing a top surface of the semiconductor layers 102 and/or a top surface p-type layer 104$p$. In one or more embodiments, the mesa 108 can be patterned according to any appropriate technique known one of skill in the art, such as a masking and etching process used in semiconductor processing.

Figure 1E:
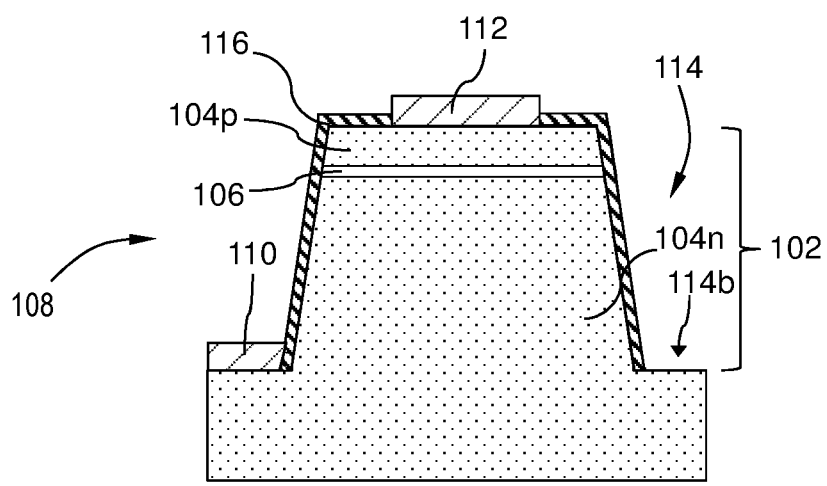
FIG. 1E illustrates a cross-sectional view of a step in the manufacture of a LED device according to one or more embodiments.

FIG. 1E is a cross-sectional view of a step in the manufacture of a LED device according to one or more embodiments. With reference to FIG. 1E, a p-contact material 112 is deposited on top of the mesa 108 in opening 109. The p-contact material 112 can comprise any suitable material known to the skilled artisan. In one or more embodiments, the p-contact material 112 comprises one or more of silver (Ag), gold (Au), platinum (Pt), and palladium (Pd). In some embodiments, additional metals may be added in small quantities to the p-contact as adhesion promoters. Such adhesion promoters, include, but are not limited to, one or more of nickel (Ni), titanium (Ti), and chromium (Cr). In other embodiments, a transparent conductive oxide (TCO) may be used as a p-contact material, such as, but not limited to, indium tin oxide (ITO) and zinc oxide (ZnO).

In one or more embodiments, an n-contact material 110 is deposited on the bottom surface 114$b$ of the trench 114. The n-contact material 110 can comprise any appropriate material known to the skilled artisan. In one or more embodiments, the n-contact material 110 comprises copper (Cu) and the n-contact material 110 is deposited by electrochemical deposition (ECD) of the copper.

Figure 2A:
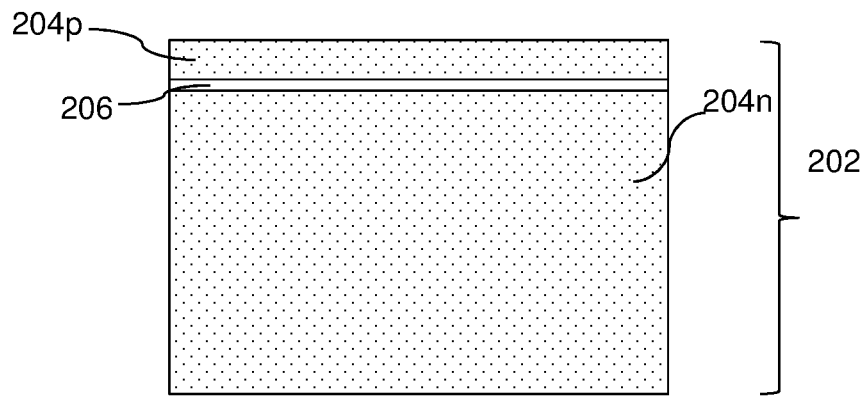
FIG. 2A illustrates a cross-sectional view of a stack of epitaxial layers according to one or more embodiments.

FIG. 2A is a cross-sectional view of a step in the manufacture of an LED device according to one or more embodiments. With reference to FIG. 2A, semiconductor layers 202 are grown on a substrate (not illustrated). The semiconductor layers 202 according to one or more embodiments comprise epitaxial layers, III-nitride layers or epitaxial III-nitride layers.

In one or more embodiments, the semiconductor layers 202 comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers 202 comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. In one or more specific embodiments, the semiconductor layers 202 comprise a p-type layer 204$p$, an active region 206, and an n-type layer 204$n$.

In one or more embodiments, the semiconductor layers 202 comprise a stack of undoped III-nitride material and doped III-nitride material. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In specific embodiments, the semiconductor layers 202 comprise an n-type layer 204n, an active layer 206 and a p-type layer 204p.

In one or more embodiments, the semiconductor layers 202 have a combined thickness in a range of from about 1 μm to about 10 μm, including a range of from about 1 μm to about 9 μm, 1 μm to about 8 μm, 1 μm to about 7 μm, 1 μm to about 6 μm, 1 μm to about 5 μm, 1 μm to about 4 μm, 1 μm to about 3 μm, 2 μm to about 10 μm, including a range of from about 2 μm to about 9 μm, 2 μm to about 8 μm, 2 μm to about 7 μm, 2 μm to about 6 μm, 2 μm to about 5 μm, 2 μm to about 4 μm, 2 μm to about 3 μm, 3 μm to about 10 μm, 3 μm to about 9 μm, 3 μm to about 8 μm, 3 μm to about 7 μm, 3 μm to about 6 μm, 3 μm to about 5 μm, 3 μm to about 4 μm, 4 μm to about 10 μm, 4 μm to about 9 μm, 4 μm to about 8 μm, 4 μm to about 7 μm, 4 μm to about 6 μm, 4 μm to about 5 μm, 5 μm to about 10 μm, 5 μm to about 9 μm, 5 μm to about 8 μm, 5 μm to about 7 μm, 5 μm to about 6 μm, 6 μm to about 10 μm, 6 μm to about 9 μm, 6 μm to about 8 μm, 6 μm to about 7 μm, 7 μm to about 10 μm, 7 μm to about 9 μm, or 7 μm to about 8 μm. In some embodiments, the semiconductor layers 202 are epitaxial layers having a thickness of greater than about 1 micron (μm).

In one or more embodiments, an active region 206 is formed between the n-type layer 204n and the p-type layer 204p. The active region 206 may comprise any appropriate materials known to one of skill in the art. In one or more embodiments, the active region 206 is comprised of a III-nitride material multiple quantum wells (MQW), and a III-nitride electron blocking layer.

Figure 2B:
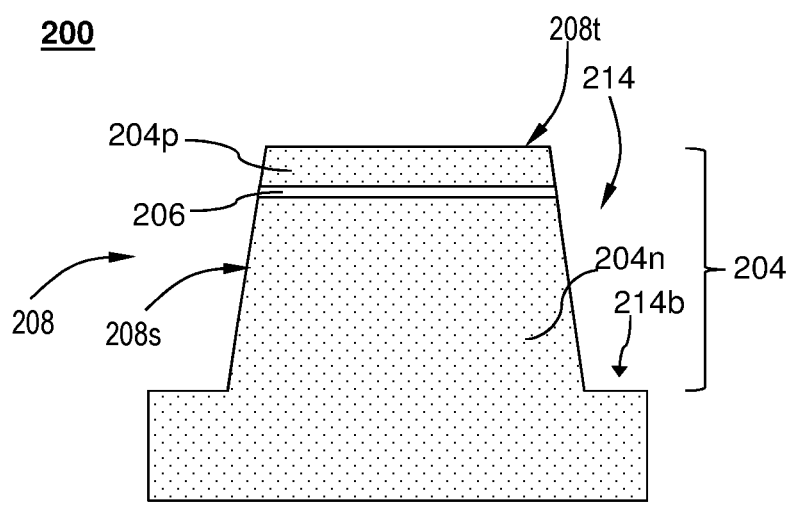
FIG. 2B illustrates a cross-sectional view of a step in the manufacture of a LED device according to one or more embodiments.

FIG. 2B is a cross-sectional view of a step in the manufacture of an LED device 200 according to one or more embodiments. With reference to FIG. 2B, the semiconductor layers 202 are etched to form a mesa 2108. In the embodiment illustrated in FIG. 2B, the mesa 208 has a top surface 208t and at least one side wall 208s, the at least one side wall 208s defining a trench 214 having a bottom surface 214b. In one or more embodiments, the trench 214 has a depth from a top surface 208t of the semiconductor layers 202 forming the mesa 208 in a range of from about 0.5 μm to about 2 μm.

Figure 2C:
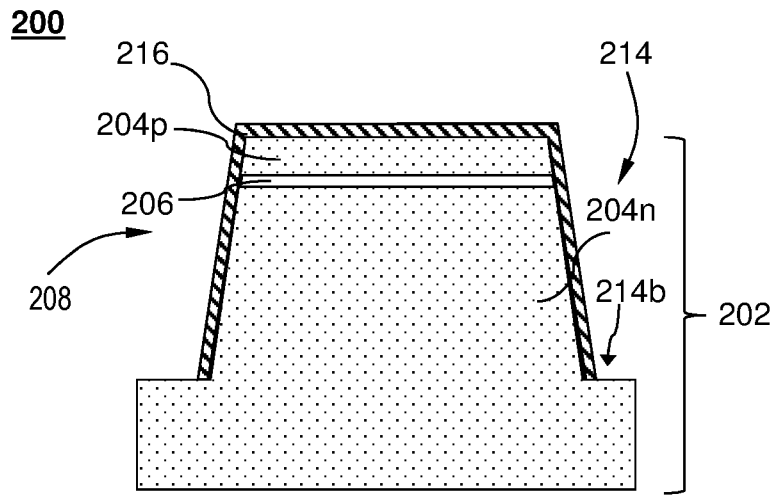
FIG. 2C illustrates a cross-sectional view of a step in the manufacture of a LED device according to one or more embodiments.

FIG. 2C is a cross-sectional view of a step in the manufacture of an LED device 200 according to one or more embodiments. With reference to FIG. 2C, a first passivation layer 216 is deposited on the top surface 208t and on the sidewall(s) 208s of the mesa 208. In one or more embodiments, the first passivation layer may be deposited conformally on the top surface 208t and the sidewall(s) 208s of the mesa 208. The first passivation layer 216 does not form on the bottom surface 214b of the trench 214. In one or more embodiments, the first passivation layer 216 has a thickness of greater than or equal to 0.1 nm. In one or more embodiments, the first passivation layer 216 is deposited by one or more of sputter deposition, atomic layer deposition (ALD), chemical vapor deposition (CVD), physical vapor deposition (PVD), plasma enhanced atomic layer deposition (PEALD), and plasma enhanced chemical vapor deposition (PECVD).

In one or more embodiments, the first passivation layer 216 comprises one of more of silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$).

Figure 2D:
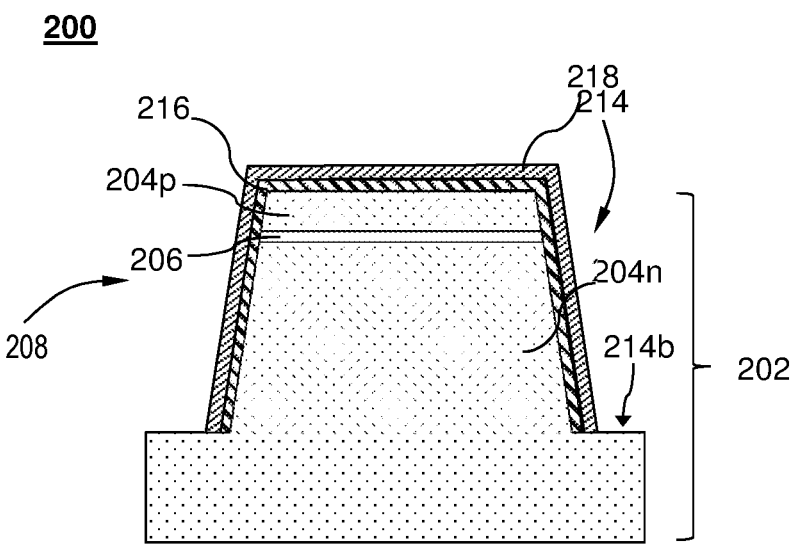
FIG. 2D illustrates a cross-sectional view of a step in the manufacture of a LED device according to one or more embodiments.

FIG. 2D is a cross-sectional view of a step in the manufacture of an LED device 200 according to one or more embodiments. With reference to FIG. 2D, a second passivation layer 218 is deposited on a top surface of the first passivation layer 216. In one or more embodiments, the second passivation layer 218 may form conformally on the first passivation layer 216. In some embodiments, the second passivation layer 218 has a thickness of greater than or equal to 2 nm. In one or more embodiments, the second passivation layer 218 may comprise one or more of a distributed Bragg reflector (DBR) and a low-loss, low-index dielectric material.

In one or more embodiments, the distributed Bragg reflector (DBR) comprises multilayers of alternating thin film materials of different refractive index, wherein high reflectance is one of the key attributes. A Bragg reflector or mirror is a structure formed from a multilayer stack of alternating thin film materials with varying refractive index, for example high- and low-index films. As a result of inter-layer mixing during multilayer depositions, additional interfacial layers form between adjacent layers of different materials. Bragg reflectors must have high reflectance. The structure and properties of the interfacial layers in the multilayer stack play a vital role in the reflectance of Bragg reflectors. In some embodiments, the distribute Bragg reflector has a thickness of at least 0.2 microns.

In one or more embodiments, the low-loss, low-index dielectric material may comprise any suitable material known to the skill artisan. In some embodiments, the low-loss, low-index dielectric material comprises a material having a refractive index, k-value, in a range of from about 1 to about 2.2.

In some embodiments, the low-loss, low-refractive index material comprises a material selected from the group consisting of silicon oxide ($SiO_2$), magnesium fluoride ($MgF_2$), lithium fluoride (LiF), porous silicon oxide ($SiO_x$), porous silicon oxynitride (SiON), porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP). In one or more embodiments, the low-loss, low-refractive index material comprises a material selected from the group consisting of magnesium fluoride ($MgF_2$), lithium fluoride (LiF), porous silicon oxide ($SiO_x$), porous silicon oxynitride (SiON), porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP). In one or more embodiments, the low-loss, low-refractive index material comprises silicon oxide ($SiO_2$). In one or more embodiments, the low-loss, low-refractive index material comprises magnesium fluoride ($MgF_2$). In one or more embodiments, the low-loss, low-refractive index material comprises lithium fluoride (LiF). In one or more embodiments, the low-loss, low-refractive index material comprises porous silicon oxide ($SiO_x$). In one or more embodiments, the low-loss, low-refractive index material comprises porous silicon oxynitride (SiON). In one or more embodiments, the low-loss, low-refractive index material comprises porous silicon nitride (SiN). In one or more embodiments, the low-loss, low-refractive index material comprises porous titanium oxide ($TiO_x$). In one or more embodiments, the low-loss, low-refractive index material comprises porous aluminum oxide ($AlO_x$). In one or more embodiments, the low-loss, low-refractive index material comprises porous hafnium oxide (HfO$_x$). In one or more embodiments, the low-loss, low-refractive index material comprises porous niobium oxide (NbO$_x$). In one or more embodiments, the low-loss, low-refractive index material comprises porous aluminum indium gallium nitride (AlInGaN). In one or more embodiments, the low-loss, low-refractive index material comprises porous aluminum indium gallium phosphide (AlInGaP).

Figure 2E:
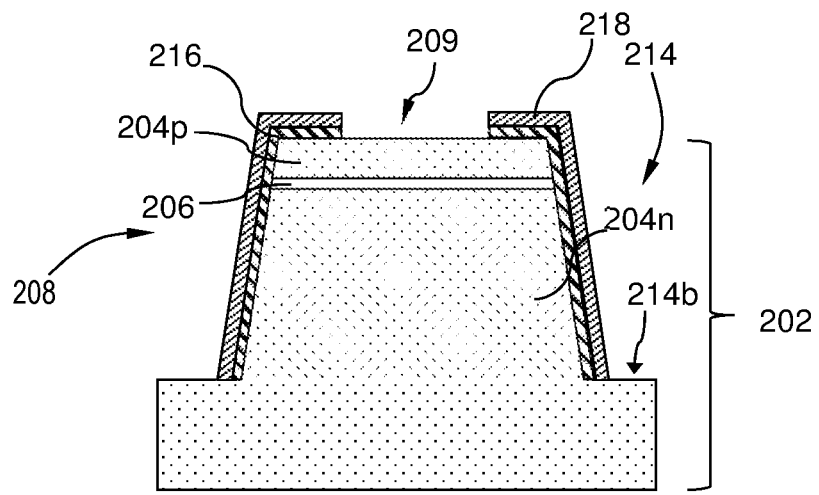
FIG. 2E illustrates a cross-sectional view of a step in the manufacture of a LED device according to one or more embodiments.

FIG. 2E is cross-sectional view of a step in the manufacture of an alternative LED device 200 according to one or more embodiments. With reference to FIG. 2E, the mesa 208 having the first passivation layer 216 and the second passivation layer 218 thereon is patterned to form an opening 209 on the top surface 208t of the mesa, exposing a top surface of the semiconductor layers 202 and/or a top surface p-type layer 204p. In one or more embodiments, the mesa 208 can be patterned according to any appropriate technique known one of skill in the art, such as a masking and etching process used in semiconductor processing.

Figure 2F:
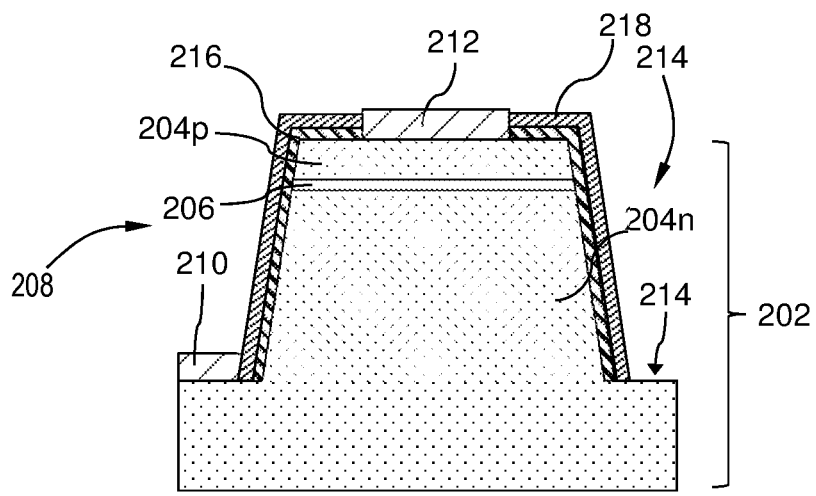
FIG. 2F illustrates a cross-sectional view of a step in the manufacture of a LED device according to one or more embodiments.

FIG. 2F is a cross-sectional view of a step in the manufacture of an alternative LED device according to one or more embodiments. With reference to FIG. 2E, a p-contact material 212 is deposited on top of the mesa 208. The p-contact material 212 can comprise any appropriate material known to the skilled artisan. In one or more embodiments, the p-contact material 212 comprises one or more of silver (Ag), gold (Au), platinum (Pt), and palladium (Pd). In some embodiments, additional metals may be added in small quantities to the p-contact as adhesion promoters. Such adhesion promoters, include, but are not limited to, one or more of nickel (Ni), titanium (Ti), and chromium (Cr). In other embodiments, a transparent conductive oxide (TCO) may be used as a p-contact material, such as, but not limited to, indium tin oxide (ITO) and zinc oxide (ZnO).

In one or more embodiments, an n-contact material 210 is deposited on the bottom surface 214b of the trench 214. The n-contact material 210 can comprise any appropriate material known to the skilled artisan. In one or more embodiments, the n-contact material 210 comprises copper and the n-contact material 210 is deposited by electrochemical deposition (ECD) of the copper.

Figure 3:
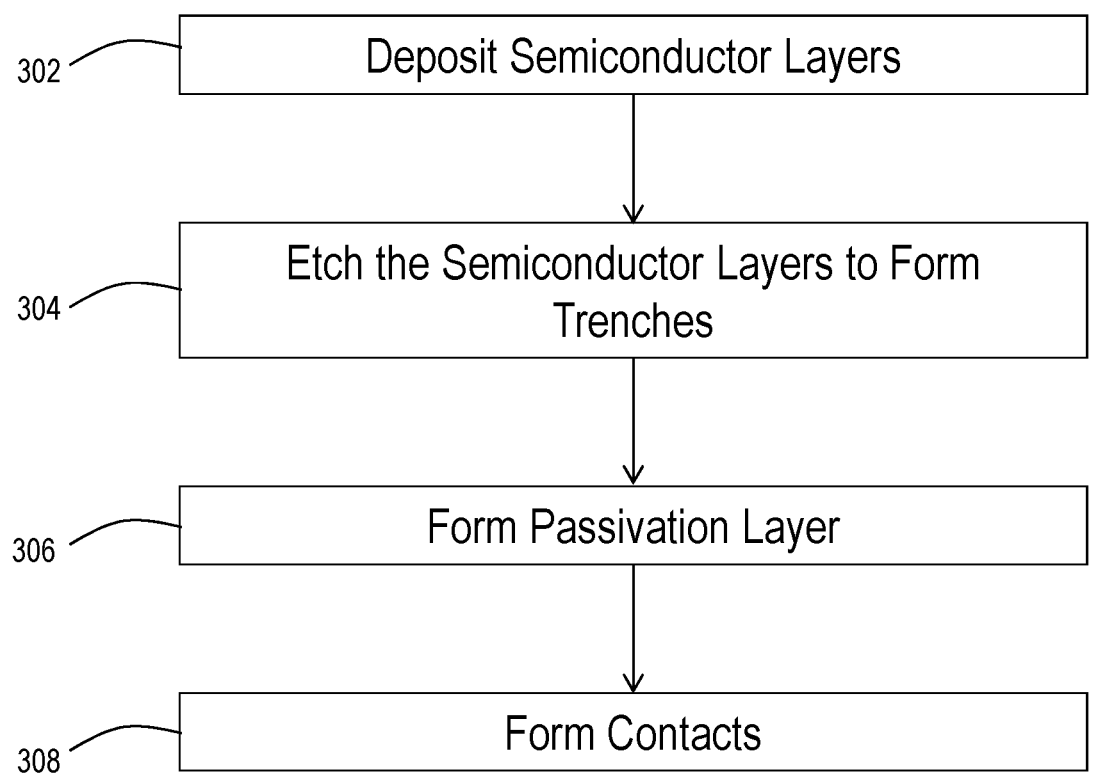
FIG. 3 illustrates a process flow diagram for a method of manufacture according to one or more embodiments.

With reference to FIG. 3, one or more embodiments of the disclosure provide a method of manufacturing an LED device, the method 300 comprises at operation 302 depositing a plurality of semiconductor layers including an n-type layer, an active layer, and a p-type layer on a substrate. At operation 304, a portion of the semiconductor layers are etched to form trenches and mesas defining pixels. At operation 306, a passivation layer is form on the mesa. At operation 308, contacts are formed by etching an opening and depositing contact metals.

Another aspect of the disclosure pertains to an electronics system. In one or more embodiments, an electronic system comprises the LED devices and arrays described herein and driver circuitry configured to provide independent voltages to one or more of p-contact layers. In one or more embodiments, the electronic system is selected from the group consisting of a LED-based luminaire, a light emitting strip, a light emitting sheet, an optical display, and a microLED display.

Embodiments

Various embodiments are listed below. It will be understood that the embodiments listed below may be combined with all aspects and other embodiments in accordance with the scope of the invention.

Embodiment (a). A light emitting diode (LED) device comprising: a mesa comprising semiconductor layers, the semiconductor layers including an N-type layer, an active layer, and a P-type layer, the mesa having a top surface and at least one side wall, the at least one side wall defining a trench have a bottom surface; a passivation layer on the at least one side wall and on the top surface of the mesa, the passivation layer comprising one or more a low-refractive index material and distributed Bragg reflector (DBR); a p-type contact on the top surface of the mesa; and an n-type contact on the bottom surface of the trench.

Embodiment (b). The LED device of embodiment (a), wherein the passivation layer comprises a low-refractive index material.

Embodiment (c). The LED device of embodiments (a) to (b), wherein the passivation layer has a thickness of at least 2 nm.

Embodiment (d). The LED device of embodiments (a) to (c), wherein the low-refractive index material has a refractive index in a range of from about 1 to about 2.2.

Embodiment (e). The LED device of embodiments (a) to (d), wherein the low-refractive index material comprises a material selected from the group consisting of silicon oxide (SiO$_2$), magnesium fluoride (MgF$_2$), lithium fluoride (LiF), porous silicon oxide (SiO$_x$), porous silicon oxynitride (SiON), porous silicon nitride (SiN), porous titanium oxide (TiO$_x$), porous aluminum oxide (AlO$_x$), porous hafnium oxide (HfO$_x$), porous niobium oxide (NbO$_x$), porous aluminum indium gallium nitride (AlInGaN), and porous aluminum indium gallium phosphide (AlInGaP).

Embodiment (f). The LED device of embodiments (a) to (e), wherein the passivation layer comprises a distributed Bragg reflector (DBR).

Embodiment (g). The LED device of embodiments (a) to (f), wherein the distributed Bragg reflector (DBR) has a thickness of at least 0.2 microns.

Embodiment (h). The LED device of embodiments (a) to (g), further comprising an electrical passivation layer between the passivation layer and the mesa.

Embodiment (i). The LED device of embodiments (a) to (h), wherein the electrical passivation layer comprises one or more of silicon nitride (SiN), titanium oxide (TiO$_2$), niobium oxide (NbO$_2$), aluminum oxide (Al$_2$O$_3$), hafnium oxide (HfO$_2$), aluminum nitride (AlN), silicon dioxide (SiO$_2$), and hafnium-doped silicon dioxide (HfSiO$_2$).

Embodiment (j). The LED device of embodiments (a) to (i), wherein the semiconductor layers are epitaxial semiconductor layers having a thickness at least 1 micron.

Embodiment (k). A method of manufacturing a light emitting diode (LED) device comprising: depositing a plurality of semiconductor layers including an N-type layer, an active layer, and a P-type layer on a substrate; etching a portion of the semiconductor layers to form at least one trench and at least one mesa defining a pixel, the at least one mesa comprising the semiconductor layers, a top surface and at least one side wall; depositing a passivation layer on the at least one side wall and on the top surface of the at least one mesa, the passivation layer comprising one or more a low-refractive index material and distributed Bragg reflector (DBR); forming a p-type contact on the top surface of the at least one mesa; and forming an n-type contact in the at least one trench.

Embodiment (l). The method of embodiment (k), wherein the passivation layer comprises a low-refractive index material.

Embodiment (m). The method of embodiments (k) to (l), wherein the passivation layer has a thickness of at least 2 nm.

Embodiment (n). The method of embodiments (k) to (m), wherein the low-refractive index material has a refractive index in a range of from about 1 to about 2.2.

Embodiment (o). The method of embodiments (k) to (n), wherein the low-refractive index material comprises one or more of silicon oxide ($SiO_2$), magnesium fluoride ($MgF_2$), lithium fluoride (LiF), porous silicon oxide ($SiO_x$), porous silicon oxynitride (SiON), porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP).

Embodiment (p). The method of embodiments (k) to (o), wherein the passivation layer comprises a distributed Bragg reflector (DBR).

Embodiment (q). The method of embodiments (k) to (p), further comprising depositing an electrical passivation layer between the passivation layer and the at least one mesa.

Embodiment (r). The method of embodiments (k) to (q), wherein the electrical passivation layer comprises one or more of silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$).

Embodiment (s). A light emitting diode (LED) device comprising: a mesa comprising semiconductor layers, the semiconductor layers including an N-type layer, an active layer, and a P-type layer, the mesa having a height less than or equal to its width, the mesa having a top surface and at least one side wall, the at least one side wall defining a trench have a bottom surface; a first passivation layer on the at least one side wall and on the top surface of the mesa, the first passivation layer comprising one or more of a silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$); a second passivation layer on the first passivation layer, the second passivation layer comprising one or more of a distributed Bragg reflector (DBR) and a low-refractive index material having a refractive index in a range of from about 1 to about 2.2; a p-type contact on the top surface of the mesa; and an n-type contact on the bottom surface of the trench.

Embodiment (t). The LED device of embodiment (s), wherein the low-refractive index material comprises one or more of silicon oxide ($SiO_2$), magnesium fluoride ($MgF_2$), lithium fluoride (LiF), porous silicon oxide ($SiO_x$), porous silicon oxynitride (SiON), porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP).

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting diode (LED) device comprising:
   a mesa comprising semiconductor layers, the semiconductor layers including an N-type layer, an active layer, and a P-type layer, the mesa having a top surface and at least one side wall, the at least one side wall defining a trench having a bottom surface;

a passivation layer on the at least one side wall and on the top surface of the mesa and not on the bottom surface of the trench, the passivation layer comprising a low-refractive index material, the low-refractive index material having a refractive index of about 1 and selected from the group consisting of, porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP);

an electrical passivation layer between the passivation layer and the mesa, the electrical passivation layer comprising one or more of silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$);

a p-type contact on the top surface of the mesa; and an n-type contact on the bottom surface of the trench.

2. The LED device of claim 1, wherein the passivation layer has a thickness of at least 2 nm.

3. The LED device of claim 1, wherein the semiconductor layers are epitaxial semiconductor layers having a thickness at least 1 micron.

4. A method of manufacturing a light emitting diode (LED) device comprising:

depositing a plurality of semiconductor layers including an N-type layer, an active layer, and a P-type layer on a substrate;

etching a portion of the semiconductor layers to form at least one trench and at least one mesa defining a pixel, the at least one mesa comprising the semiconductor layers, a top surface and at least one side wall, the at least one trench having a bottom surface;

depositing a passivation layer on the at least one side wall and on the top surface of the at least one mesa and not on the bottom surface of the trench, the passivation layer comprising a low-refractive index material, the low-refractive index material having a refractive index of about 1 and selected from the group consisting of, porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP);

depositing an electrical passivation layer between the passivation layer and the at least one mesa, the electrical passivation layer comprising one or more of silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$);

forming a p-type contact on the top surface of the at least one mesa; and forming an n-type contact in the at least one trench.

5. The method of claim 4, wherein the passivation layer has a thickness of at least 2 nm.

6. A light emitting diode (LED) device comprising:

a mesa comprising semiconductor layers, the semiconductor layers including an N-type layer, an active layer, and a P-type layer, the mesa having a height less than or equal to its width, the mesa having a top surface and at least one side wall, the at least one side wall defining a trench having a bottom surface;

a first passivation layer on the at least one side wall and on the top surface of the mesa and not on the bottom surface of the trench, the first passivation layer comprising one or more of a silicon nitride (SiN), titanium oxide ($TiO_2$), niobium oxide ($NbO_2$), aluminum oxide ($Al_2O_3$), hafnium oxide ($HfO_2$), aluminum nitride (AlN), silicon dioxide ($SiO_2$), and hafnium-doped silicon dioxide ($HfSiO_2$);

a second passivation layer on the first passivation layer, the second passivation layer comprising a low-refractive index material having a refractive index in of about 1, wherein the low-refractive index material comprises a material selected from the group consisting of, porous silicon nitride (SiN), porous titanium oxide ($TiO_x$), porous aluminum oxide ($AlO_x$), porous hafnium oxide ($HfO_x$), porous niobium oxide ($NbO_x$), porous aluminum indium gallium nitride (AlInGaN), and porous aluminum indium gallium phosphide (AlInGaP);

a p-type contact on the top surface of the mesa; and an n-type contact on the bottom surface of the trench.

\* \* \* \* \*